(12) United States Patent
Godfried et al.

(10) Patent No.: US 11,287,743 B2
(45) Date of Patent: Mar. 29, 2022

(54) CONTROL SYSTEM AND METHOD

(71) Applicant: ASML Netherlands B.V., Veldhoven (NL)

(72) Inventors: Herman Philip Godfried, Amsterdam (NL); Frank Everts, Eindhoven (NL); Wilhelmus Patrick Elisabeth Maria Op 'T Root, Nederweert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/977,667

(22) PCT Filed: Feb. 21, 2019

(86) PCT No.: PCT/EP2019/054340
§ 371 (c)(1),
(2) Date: Sep. 2, 2020

(87) PCT Pub. No.: WO2019/174885
PCT Pub. Date: Sep. 19, 2019

(65) Prior Publication Data
US 2020/0401050 A1   Dec. 24, 2020

(30) Foreign Application Priority Data

Mar. 12, 2018   (EP) .................... EP18161160

(51) Int. Cl.
*G03F 7/20* (2006.01)
*H01S 3/13* (2006.01)

(52) U.S. Cl.
CPC ...... *G03F 7/70025* (2013.01); *G03F 7/70041* (2013.01); *G03F 7/7085* (2013.01); *G03F 7/70558* (2013.01); *H01S 3/1305* (2013.01)

(58) Field of Classification Search
CPC ............. G03F 7/70025; G03F 7/70558; G03F 7/70041; G03F 7/7085; G03F 7/70325;
(Continued)

(56) References Cited

U.S. PATENT DOCUMENTS 5,081,635 A  *  1/1992  Wakabayashi ...... G03F 7/70025
                                                              372/20
5,142,543 A      8/1992  Wakabayashi et al.
(Continued)

FOREIGN PATENT DOCUMENTS

WO   WO 2017/050506 A1   3/2017
WO   WO 2019/079010 A1   4/2019
WO   WO 2019/190700 A1   10/2019

OTHER PUBLICATIONS

International Search Report and Written Opinion of the International Searching Authority, directed to related International Patent Application No. PCT/EP2019/054340, dated May 20, 2019; 11 pages.
(Continued)

*Primary Examiner* — Christina A Riddle
(74) *Attorney, Agent, or Firm* — Sterne, Kessler, Goldstein & Fox P.L.L.C.

(57) ABSTRACT

A control system for controlling a laser, comprising a sensor for sensing a physical value indicative of a characteristic of a laser beam emitted by the laser, a switch, a first controller and a second controller. Each controller is configured, to receive a further sensor value from the sensor, adjust a received setpoint value based on the received further sensor value to give an output value and cause the laser to operate in accordance with the output value. The switch is configured to switch between the controllers such that output values are provided from each controller in a cyclic fashion.

15 Claims, 4 Drawing Sheets

(58) Field of Classification Search
CPC .............. G03F 7/7033; G03F 7/70375; G03F 7/70416; G03F 7/70425; G03F 7/70466; G03F 7/70483–7541; G03F 7/7055–70583; G03F 7/70625; G03F 9/7026; G03F 7/20; G03F 7/2002; G03F 7/2004; G03F 7/2006; H01S 3/1305; H01S 3/134; H01S 3/097; H01S 3/104; H01S 3/1306; H01S 30/97; H01S 30/104; H01S 30/13; H01S 30/134
USPC ......... 355/18, 32, 35, 46, 52–55, 67–71, 77; 372/8, 9, 20, 23, 25, 29.01, 29.014, 38.1, 372/38.01, 38.02, 38.03, 109; 250/492.1–492.22, 492.23, 493.1, 503.1, 250/504 R, 505.1
See application file for complete search history.

(56) References Cited

U.S. PATENT DOCUMENTS

| | | |
|---|---|---|
| 6,243,405 B1 | 6/2001 | Bomeis et al. |
| 6,671,294 B2 | 12/2003 | Kroyan et al. |
| 6,829,040 B1 | 12/2004 | Kye et al. |
| 6,853,653 B2 | 2/2005 | Spangler et al. |
| 7,088,758 B2 | 8/2006 | Sandstrom et al. |
| 7,154,928 B2 | 12/2006 | Sandstrom et al. |
| 7,256,870 B2 | 8/2007 | Finders |
| 7,286,207 B2 | 10/2007 | Nolscher et al. |
| 7,525,638 B2 | 4/2009 | Buurman et al. |
| 7,534,552 B2 | 5/2009 | De Kruif et al. |
| 7,612,868 B2 | 11/2009 | Tsuchiya |
| 8,705,004 B2 | 4/2014 | Butler et al. |
| 8,989,225 B2 | 3/2015 | Kakizaki et al. |
| 9,207,119 B2 | 12/2015 | Rokitski et al. |
| 9,235,136 B2 | 1/2016 | Epple |
| 9,989,866 B2 | 6/2018 | Mason et al. |
| 2002/0106821 A1 | 8/2002 | Bode et al. |
| 2005/0083983 A1 | 4/2005 | Sandstrom et al. |
| 2006/0146310 A1* | 7/2006 | De Kruif ............ G03F 7/70641 355/69 |
| 2006/0261050 A1 | 11/2006 | Krishnan et al. |
| 2007/0013889 A1 | 1/2007 | Jorritsma et al. |
| 2007/0222961 A1 | 9/2007 | Schmidt |

OTHER PUBLICATIONS

International Preliminary Report on Patentability directed to related International Patent Application No. PCT/EP2019/054340, dated Sep. 15, 2020; 9 pages.

\* cited by examiner

CONTROL SYSTEM AND METHOD

CROSS-REFERENCE TO RELATED APPLICATIONS

This application claims priority of EP application 18161160.9 which was filed on 12 Mar. 2018 and which is incorporated herein in its entirety by reference.

FIELD

The present invention relates to a control system and method for controlling a radiation source, and has particular, but not exclusive, application to radiation sources for lithographic apparatuses.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Developments in memory cells of computer memory have led to the creation of "3D" stacked memory, which is arranged in multiple storeys rather than as a single layer. The use of 3D memory means that resists are becoming significantly thicker. For example, single-layer memory (also referred to as "2D" memory) may be of the order of 200 nm in thickness, however, 3D memory may be several microns thick. Such thick resists may need to be exposed at high doses over the full thickness of the resist. However, increased thicknesses of resist can lead to problems of poor focus over the full thickness of the resist. In addition, such high topography structures lead to significant wafer bending resulting in even further focus problems.

Current solutions try to optimise focus by targeting a location near the middle of the thick resist. For 3D, "bent" wafers, focusing may also be achieved with large adjustments of the wafer stage height and tilt. However, this can lead to problems with local stress in the wafer and with alignment of the wafer stage.

It is desirable to obviate or mitigate one or more of the problems of the prior art, whether identified herein or elsewhere.

SUMMARY

According to a first aspect of the invention, there is provided a control system for controlling a laser, the control system comprising a sensor for sensing a physical value indicative of a characteristic of a laser beam emitted by the laser, a switch, a first controller and a second controller. Each controller is configured to receive a setpoint value, receive a further sensor value from the sensor, adjust the received setpoint value based on the received further sensor value to give an output value and cause the laser to operate in accordance with the output value. An output value from the first controller is different from an output value from the second controller and the switch is configured to switch between the controllers such that output values are provided from each controller in a cyclic fashion. The controllers are configured to communicate with one another, and at least one adjustment to the setpoint value made by the second controller is determined at least in part by at least one adjustment to the setpoint value made by the first controller.

In this way, improved control of the radiation source is advantageously provided. In addition, by enabling communication between the controllers of the control system, adjustments to the operation of the laser caused by the control system can be set so as to minimize detrimental stress to the laser. Communication between the controllers may be implemented in a large variety of ways known to the skilled person.

The laser may be a pulsed laser and the switch may be configured to switch between the controllers on a pulse to pulse basis. Alternatively, the switch may switch between the controllers according to a different switching scheme, depending on requirements.

The laser may be configured to provide more than one type of output, e.g. laser beams of different wavelengths. Where the laser is configured to provide more than one type of output, each controller of the control system may be configured to control a respective type of output, e.g. each controller controls a laser beam having a respective wavelength. In this way, lasers providing more than one type of output, such as laser beams of different wavelengths, may be more accurately controlled with a single control system.

Advantageously, each controller may comprise a limiter configured to adjust the output value in accordance with predetermined limits. In this way, limits may be set so as to avoid successive adjustments overly stressing the laser. Furthermore, the limiters of each controller may be configured to communicate with one another. For example, the limiters may be configured to communicate instances of conditional reset performed by each limiter.

Each controller may comprise a tuning unit configured to adjust the setpoint value based on the received further sensor value to give the output value. The tuning unit may comprise a PID module, a PIM module, a PII module, a PDD module or other architecture depending on requirements.

The output value may be configured to control the energy dose of the laser. Alternatively or in addition, the output value may be configured to control the wavelength emitted by the laser.

According to a second aspect of the invention there is provided a radiation source comprising a control system according to the first aspect, wherein the control system is configured to control a laser of the radiation source.

According to a third aspect of the invention, there is provided a lithographic system comprising a radiation source according to the second aspect and a lithographic apparatus, the lithographic apparatus comprising an illumination system for conditioning a radiation beam emitted by the radiation source, a support structure for supporting a patterning device, the patterning device serving to impart the radiation beam with a pattern in its cross-section, a substrate table for holding a substrate and a projection system for projecting the patterned radiation beam onto a target portion of the substrate.

According to a fourth aspect of the invention, there is provided a method for controlling a parameter of a laser using a first and a second controller, the method comprising: cycling between a first controller and a second controller, wherein each controller performs the steps of: a) receive a setpoint value for the parameter; b) receive a further sensor value from a sensor; c) adjust the received setpoint value based on the received further sensor value to give an output value; d) cause the laser to operate in accordance with the output value; wherein the controllers communicate with one another and wherein at least one adjustment to the setpoint value made by the second controller is determined at least in part by at least one adjustment to the setpoint value made by the first controller.

It will be appreciated that no temporal limitation is intended by the use of the terms 'first' and 'second'. In particular, the second controller may control the laser before the first controller and vice versa.

According to a fifth aspect of the invention, there is provided a computer program comprising computer readable instructions configured to cause a computer to carry out a method according to the fourth aspect.

According to a sixth aspect of the invention, there is provided a computer readable medium carrying a computer program according to the fifth aspect.

According to a seventh aspect of the invention, there is provided a computer apparatus for a radiation source comprising: a memory storing processor readable instructions and a processor arranged to read and execute instructions stored in said memory, wherein said processor readable instructions comprise instructions arranged to control the computer to carry out a method according to the fourth aspect.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
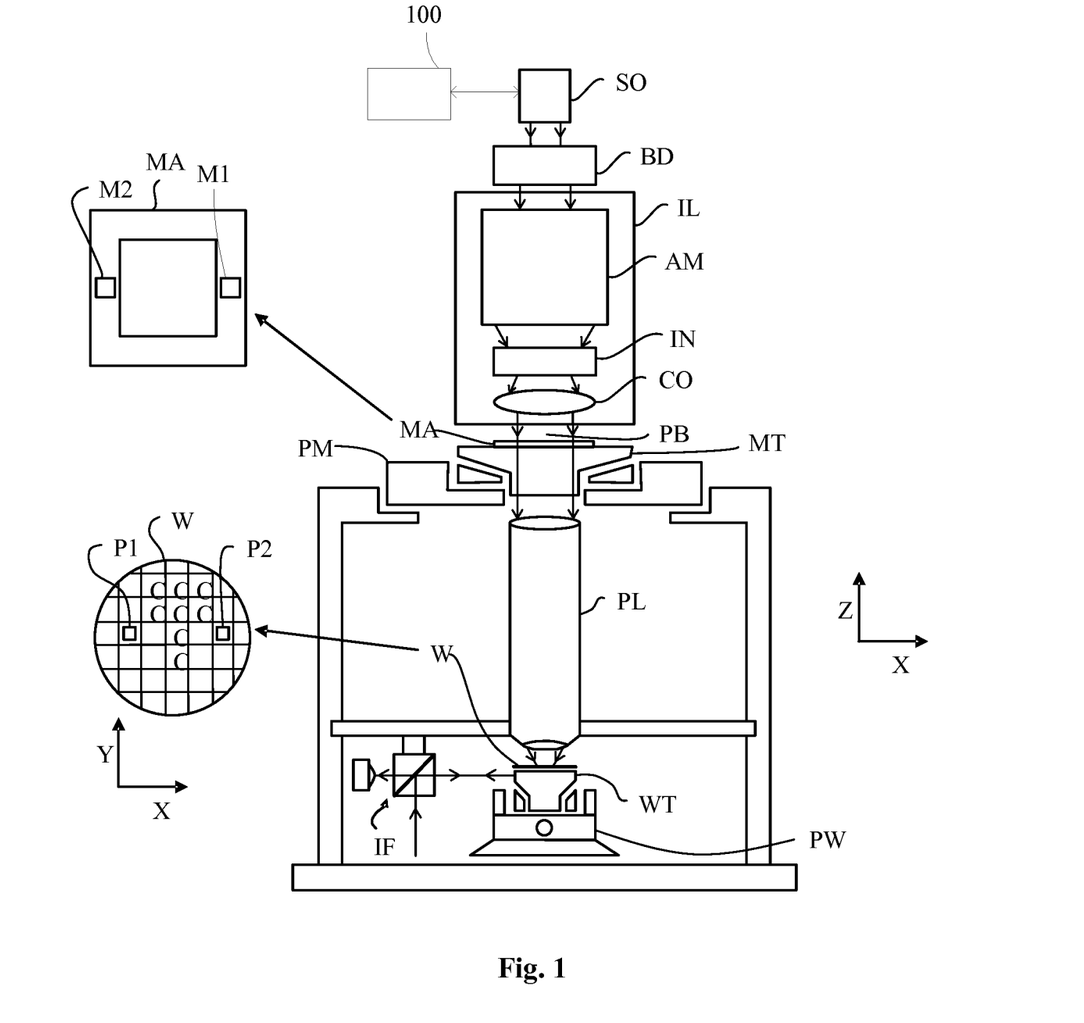
FIG. 1 depicts a lithographic apparatus according to an example arrangement described herein.

FIG. 1 schematically depicts a lithographic apparatus according to a particular implementation of the invention. The apparatus comprises:

an illumination system (illuminator) IL to condition a beam PB of radiation (e.g. UV radiation or EUV radiation);
a control system 100 for controlling the beam PB of radiation;
a support structure (e.g. a support structure) MT to support a patterning device (e.g. a mask) MA and connected to first positioning device PM to accurately position the patterning device with respect to item PL;
a substrate table (e.g. a wafer table) WT for holding a substrate (e.g. a resist coated wafer) W and connected to second positioning device PW for accurately positioning the substrate with respect to item PL; and
a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illuminator IL receives a beam of radiation from a radiation source 214 SO. The source and the lithographic apparatus may be separate entities, for example when the source is an excimer radiation source 214. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the beam PB is projected onto a target portion C. In this mode, generally a pulsed radiation source 214 is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The radiation source SO is controlled by the control system 100. For example, the control system 100 may determine a voltage value that is to be supplied to the source SO. The control system 100 may adjust the voltage value that is supplied to the control system 100 in accordance with a feedback loop. Example implementations of the control system 100 are described in more detail below with reference to FIGS. 2 and 3.

Figure 2:
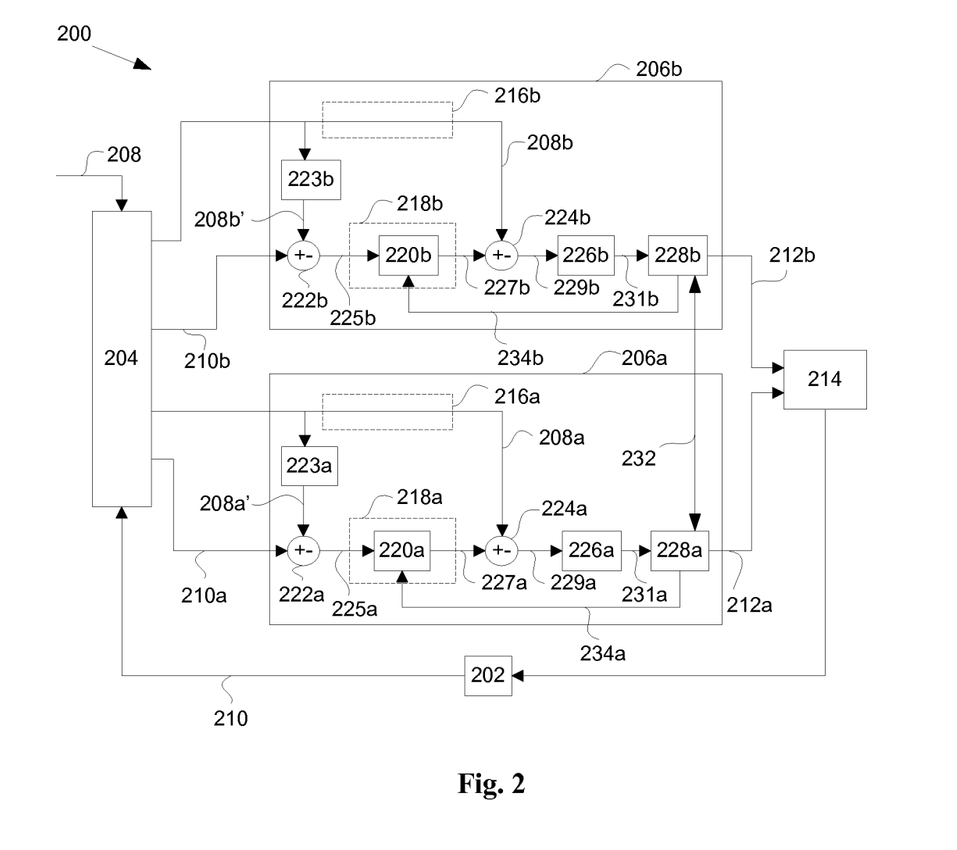
FIG. 2 depicts an example of a control system for controlling a radiation source.

FIG. 2 shows an example implementation of a control system 200 for controlling a radiation source 214. For example, the control system 200 may be used to control a radiation source 214 of an illumination system of a lithographic apparatus. For example, the control system 200 and the radiation source 214 may correspond to the control system 100 and the radiation source SO respectively of FIG. 1. The control system 200 may control various parameters of the radiation source 214, for example, the dose of a radiation beam, the wavelength of the radiation beam or another parameter associated with the radiation source 214 or the illumination system. The radiation source 214 may be a pulsed radiation source 214, that is to say, the radiation source 214 may be configured to output a beam of radiation at discrete intervals with intervening periods where no radiation beam is produced. Each individual beam of radiation can be referred to as a "pulse" of radiation. The radiation source 214 may be a laser.

The description below is generally directed to a use of the control system 200 for a lithographic system. It is to be understood, however, that the control system 200 need not be used in association with a lithographic system and may be used to control any suitable radiation source for any of a wide variety of applications.

The control system 200 comprises a sensor 202, a switch 204 and a plurality of controllers 206a, 206b. FIG. 2 shows a first controller 206a and a second controller 206b (referred to collectively as controllers 206) and for ease of description with reference to FIG. 2, operation of the control system 200 is described with reference to the two controllers 206a, 206b. However, the skilled person will appreciate that any suitable number of controllers 206 may be provided. Each controller 206a, 206b comprises similar or equivalent components denoted with like reference numerals in the Figures. Components of the first controller 206a are denoted with a reference numeral followed by an 'a' and components of the second controller 206b are denoted with the same reference numeral followed by a 'b', and the components may also be collectively referred to by the reference numeral without the 'a' or 'b'.

Each controller 206 is arranged to control the radiation source 214 to provide radiation with differing characteristics. For example, the radiation source 214 may be configured to output radiation of differing wavelengths, each wavelength targeted at a different depth (or height or "storey") within the resist. Each controller may be associated with a particular wavelength and configured to control the radiation source 214 while the radiation source 214 is outputting radiation of that wavelength.

In general terms, and as described in more detail below, within each pass of the control system 200 (e.g. where each pass controls a single pulse of the radiation source 214) one of the controllers 206a, 206b receives a respective setpoint value 208a, 208b and a respective further sensor value 210a, 210b from the sensor 202. The controllers 206 are configured to adjust (or "tune") the received respective setpoint value 208a, 208b based on the received respective further sensor value 210a, 210b to generate a respective output value 212a, 212b (referred to collectively as output values 212) and to output the respective output values 212a, 212b to cause the radiation source 214 to operate in accordance with the respective output values 212a, 212b. The output value 212a received from the first controller 206a is distinct from the output value 212b received from the second controller 206b. The switch 204 is configured to switch between the controllers 206a, 206b such that the output values 212a, 212b are provided to the radiation source 214 in a cyclic fashion.

In the example of FIG. 2, the control system 200 controls the dose of the radiation beam. The dose is the amount of energy per unit area that a photoresist is subjected to upon exposure by a lithographic system. For optical lithography, the dose is equal to the light intensity of the radiation beam multiplied by the exposure time. It will be appreciated that, when a continuous wave light source is used, the exposure time is one period of time during which radiation from the source exposes the resist. However, where a pulsed light source is used, the total exposure time may be the summation of multiple individual pulses of radiation used to expose the resist. In other words, where a pulsed light source is used, it may be necessary to sum the doses per pulse of a series of individual pulses in order to obtain the overall dose. The setpoint value 208 indicates a desired dose. Where the radiation source 214 is a pulsed radiation source 214, the setpoint value 208 indicates a desired dose for each individual pulse. The desired doses for each individual pulse are set such that a desired dose profile (in other words, the desired overall dose) is achieved over the series of pulses. In some embodiments, the number of individual pulses used to give the overall dose may be in the range from 20 to 80 pulses. It will be appreciated that the dose profile may be 'flat' or 'non-flat', that is, the setpoint value 208 may be the same for successive pulses or may be different for successive pulses, depending on requirements. In particular, a non-flat dose profile may be desirable in order to take account of interference within the system and/or stray light reaching the wafer stage, for example.

The switch 204 is operative to supply the setpoint values 208a, 208b to one of the controllers 206a, 206b of the control system 200 in dependence upon the current cycle (e.g. in dependence upon which wavelength of radiation is to be output by the radiation source 214). The control system 200 may remain in a given cycle for multiple passes of the control system (e.g. multiple successive pulses of the laser 214). For example, within a first cycle, the first controller 206a may execute for a plurality of pulses of the laser 214 before the switch switches to the second controller 206b to execute for a plurality of pulses within the next cycle.

The value of the setpoint values 208a, 208b may depend on a pattern to be applied to a resist that is to be exposed, or any other variable as will be appreciated by the skilled person.

The further sensor values 210a, 210b indicate a value of the parameter being controlled (in the case of the presently described example, the pulse energy of the radiation beam) measured by the sensor 202 from a previous pulse emitted by the radiation source 214. The first further sensor value 210a indicates a measured value for a previous pulse controlled by the first controller 206a, while the second further sensor value 210b indicates a measured value for a previous pulse controlled by the second controller 206b. Generally, each controller 206 comprises equivalent components.

Each controller 206a, 206b may comprise a respective feedforward branch 216a, 216b and a respective tuning branch 218a, 218b. The feedforward branch 216a, 216b receives the respective setpoint value 208a, 208b and provides the setpoint value 208a, 208b to a respective summation unit 224a, 224b. The tuning branch 218a, 218b receives the respective further sensor value 210a, 210b and further receives, from a respective delay unit 223a, 223b, a respective previous setpoint value 208a', 208b' associated with the pulse to which the respective further sensor value 210a, 210b relates. The tuning branch 218a, 218b uses the received further sensor value 210a, 210b and previous setpoint value 208a', 208b' to produce a respective tuning value 227a, 227b which is provided to the respective summation unit 224a, 224b. The tuning value 227a, 227b and the setpoint value 208a, 208b are combined at the respective summation unit 224a, 224b in order to provide a respective tuned setpoint value 229a, 229b.

In the example of FIG. 2, the tuning branch 218a, 218b of each controller 206a, 206b comprises a respective tuning unit 220a, 220b, which is configured to modify the respective setpoint value 208a, 208b based on the respective received further sensor value 210a, 210b according to predetermined tuning settings. Each tuning unit 220a, 220b may comprise a PID controller (the reference numerals 220, 220a, 220b are used for both tuning unit and PID controller herein). The skilled person will appreciate, however, that other tuning methods may be used, such as model predictive control or predictive functional control, for example. Alternatively, iterative learning control may be used such that the control system may be self-tuning. Where the tuning units 220 are PID controllers, the PID controllers may comprise any combination of proportional, integral and/or derivative gain units, which may each be present more than once. The proportional, integral and/or derivative gain units may have respective gains in the range from 0.1 to 10, for example from 0.1 to 5, in particular from 0.5 to 5. The tuning units 220 in each controller 206a, 206b may have the same configuration or tuning units in different controllers 206 may have different configurations. For example, PID controller tuning units may comprise the same or different gain units and the gains may be set to the same or different values.

Each controller 206a, 206b is configured to output a respective output value 212a, 212b. The output values 212a, 212b may be different from one another. The output value 212a, 212b provided by the respective controller 206a, 206 can be used to cause the radiation source 214 to operate in accordance with the output values 212a, 212b. When the switch 204 switches between the controllers 206a, 206b, the output value 212a, 212b provided to the radiation source 214 changes and, therefore, causes a change in the output of the radiation source 214. This is useful, for example, in the case of substrates having relatively very thick resists where it is intended to expose the resist over its entire thickness. In particular, in order to expose the resist over its entire thickness, two (or more) focal planes may be selected and the radiation source 214 may be controlled by the control system 200 to alternate between the selected focus planes. For example, the radiation source 214 may be configured to provide radiation of differing wavelengths, each wavelength having a different plane of best focus. Separate ones of the controllers 206a, 206b may control the radiation source 214 for each focal plane so that properties of the pulses directed at different focal planes can be controlled and adjusted individually.

Owing to the operation of the switch 204, each controller 206a, 206b can apply appropriate corrections to its respective output value 212a, 212b based upon the further sensor value 210a, 210b from a previous pulse controlled by that controller. In this way, it is possible to avoid a situation where one or each of the output values 212a, 212b deviates further and further from the setpoint values 208a, 208b because a correction that should have been applied, for example, to the output value 212a for controlling the dose at a first focal plane is erroneously applied to the other output value 212b for controlling the dose at a second focal plane.

The previous setpoint value 208a', 208b' is supplied with a delay, from the respective delay unit 223a, 223b, to a further summation unit 222a, 222b which also receives the further sensor value 210a, 210b. The further sensor value 210a, 210b is subtracted from the respective setpoint value 208a', 208b' to give a respective error value 225a, 225b. The error value 225a, 225b is supplied to the respective PID controller 220a, 220b which performs a tuning function on the error value 225a, 225b and outputs a tuning value 227a, 227b to a respective second further summation unit 224a, 224b. The second further summation unit 224a, 224b also receives the respective present setpoint value 208a, 208b via the respective feedforward branch 216a, 216b. The tuning value 227a, 227b is then added to the respective setpoint value 208a, 208b by the respective second further summation unit 224a, 224b to produce a respective tuned setpoint value 229a, 229b. The skilled person will appreciate that the tuning value 227a, 227b may be positive or negative. The tuning enables the setpoint value 208a, 208b to be modified to take account of any errors in the amount of pulse energy emitted in the previous pulse (for example, caused by noise received at the radiation source 214 or other sources of interference) such that the overall dose emitted by the radiation source 214 more closely corresponds to the desired overall dose.

The tuned setpoint value 229a, 229b is supplied to a converter 226a, 226b which converts the respective tuned setpoint value 229a, 229b into a high voltage (HV) signal 231a, 231b for outputting to the radiation source 214. In some implementations, before being passed to the radiation source 214, the HV signal 231a, 231b is first processed by a respective limiter 228a, 228b. The limiter 228a, 228b may perform rate limiting and/or clipping to ensure that the respective HV signal 231a, 213b is not set at a level which could cause damage to the radiation source 214. In particular, upper and lower limits for the HV signal 231a, 231b may be predetermined and the limiter 228a, 228b may be configured to ensure that the HV signal 231a, 231b does not exceed the predetermined limits. For example, if the HV signal 231a, 231b exceeds the upper limit, the limiter 228a, 228b may "clip" the HV signal 231a, 231b to output a respective limited HV signal 231a, 231b that is below the upper limit. In addition, the limiter 228a, 228b can monitor the rate of change of the HV signal 231a, 231b and operate to ensure that the rate of change of the HV signal 231a, 231b is controlled so as not to cause undesirable stress to the radiation source 214. That is to say, if the rate of change of the HV signal 231a, 231b is above a predetermined threshold, the limiter 228a, 228b may cause the value of the respective HV signal 231a, 231b to be adjusted such that the rate of change of the HV signal 231a, 231b is reduced to be within the predetermined threshold.

In some instances, the limiters 228a, 228b may cause operation of the respective tuning unit 220a, 220b (e.g. PID controller) to be reset. In some implementations, the reset may only occur under certain conditions. For example, in the case where the limiter 228a, 228b has limited the HV signal 231a, 231b for a previous pulse or a number of previous pulses, the limiter 228a, 228b may send a signal on a respective reset line 234a, 234b to reset operation of the tuning unit 220a, 220b in order to reduce the likelihood of the HV signal 231a, 231b requiring limitation for a subsequent pulse. The limiter 228a of the controller 206a may communicate with the limiter 228b in the other controller 206b to notify the other controller 206b when such a "conditional reset" occurs. Of course, it will be appreciated that the controllers 206a, 206b may also communicate via other means in the event of a conditional reset. For example, in some implementations components of the controllers 206a, 206b other than the limiters 238a, 238b may provide communication between the controllers 206a, 206b.

By way of additional example, where a PID controller 220a is present, the integral gain of the PID controller 220a of the controller 206a may be reset in response to an indication that the HV signal 231a produced by the other controller 206b has been modified by the limiter 228b of that other controller 206b. This can help to avoid problems associated with integral wind-up, such as a large variation in the correction value from pulse to pulse and the occurrence of impermissible overshoot errors.

Once the output value 212a has been provided to the radiation source 214, the switch 204 may switch from the first controller 206a to the second controller 206b. The second controller 206b may operate in a substantially identical way to the first controller 206a. The switch 204 is configured to switch between the controllers 206 such that each controller 206a, 206b operates in turn in a cyclic fashion. In this way, the radiation source 214 may be controlled to alternate between different values of the parameter being controlled. For example, the radiation source 214 may be controlled to alternate between different doses. If the radiation source 214 is a pulsed radiation source 214, the switch 204 may be configured to switch between the controllers 206a, 206b on a pulse-to-pulse basis. Alternatively, the switch 204 may be configured to switch between the controllers 206 at a different frequency. Depending on requirements, the switch 204 may be configured such that one of the controllers 206a, 206b provides more output values than the other one of the controllers 206a, 206b within a given cycle. Alternatively, the switch 204 may be configured such that the controllers 206a, 206b each provide the same number of output values 212a, 212b.

In some embodiments, the adjustment to the setpoint value 208a, 208b performed by one of the controllers 206a, 206b is completely independent of the adjustment to the setpoint value 208a, 208b performed by the other one of the controllers 206a, 206b. In other embodiments, each controller 206a, 206b is configured to receive a further value 232 and, in response to receiving the further value 232, to adjust the setpoint value 208a, 208b based on an adjustment to the setpoint value 208a, 208b made by another controller. For example, tuning settings (for example, gains in PID controllers 220) may be adjusted on the basis of information communicated from the other one of the controllers 206a, 206b. For example, the limiters 228a, 228b may communicate with one another to indicate whether the HV signal 231a, 231b has been modified to remain within the predetermined upper and lower limits for the HV signal 231a, 231b. If the HV signal 231a, 231b produced by one of the controllers 206a, 206b has been modified by the limiter 228a, 228b, then the tuning settings of the other one of the controllers 206a, 206b may be altered in response. By way of general example, in the case that the adjustments to be made by each of the controllers 206a, 206b are in an opposite direction, the limiters 228a, 228b may adjust the control signals provided by one or more of the controllers 206a, 206b. For example, in the event that the first controller 206a has provided a negative control signal, while the second controller 206b will next provide a positive control signal, the one of the limiters 228a, 228b may limit the control signal provided by the second controller 206b in order not to overly stress the radiation source.

It will be appreciated from the foregoing that the example arrangement depicted in FIG. 2 is merely exemplary and that other arrangements are possible. For example, while the switch 204 is depicted as selecting which of the controllers 206a, 206b to send the setpoint values and sensor values in each pass of the control system, it will be appreciated that in other arrangements, each controller 206a, 206b may receive each of the setpoint and sensor values in each pass of the control system and the switch may select between the outputs of each controller 206a, 206b.

Figure 3A:
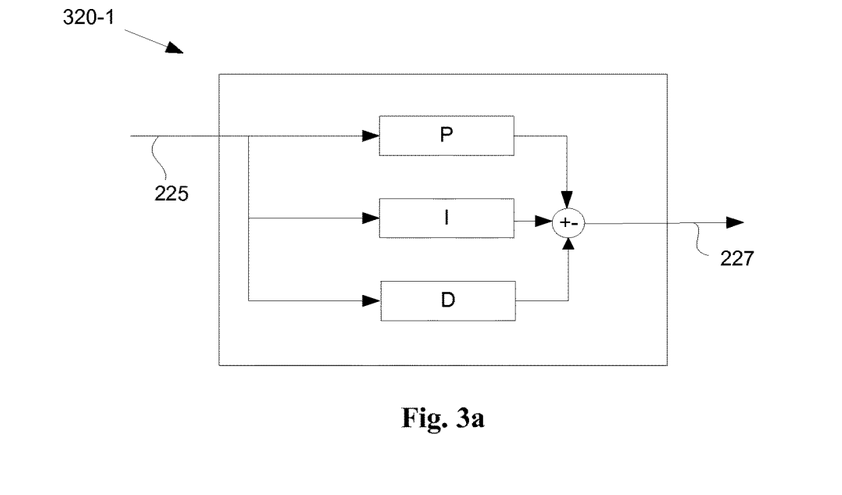
FIGS. 3a to 3c depict example configurations of a tuning unit for a control system for controlling a radiation source.
Figure 3B:
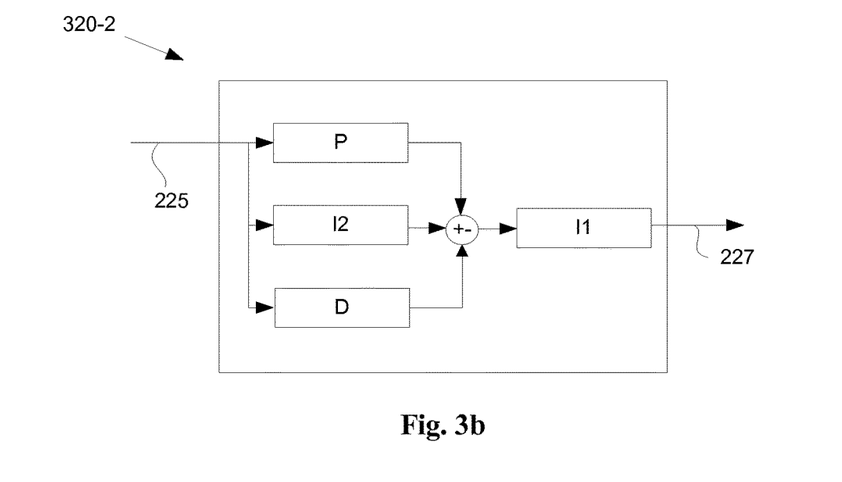
Figure 3C:
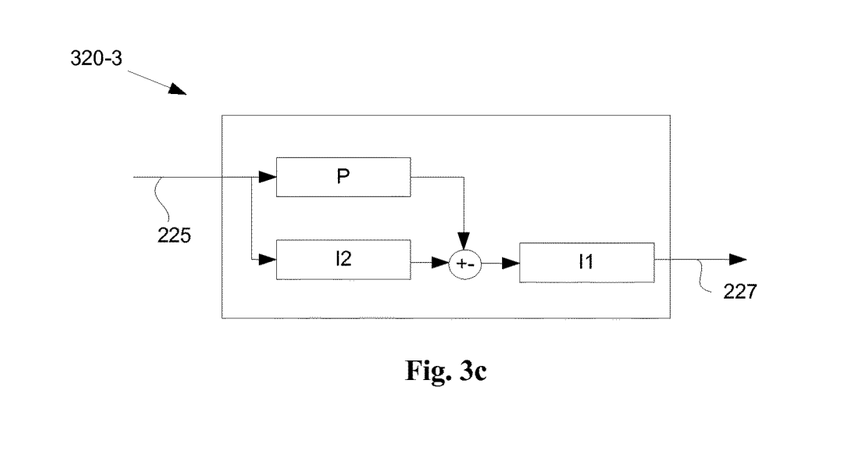

In various implementations the tuning unit 220a, 220b may include various forms of tunable feedback control. For example, certain installations may benefit from using a PID module, a PI module, a PIID module (with a second-stage integrator), a PII module, a PDD module, or other architecture depending on the characteristics of the system being regulated. For example, different approaches may have advantages depending on whether the laser source is a pulsed source or a continuous-wave source, which may have different noise characteristics that need to be controlled. Some exemplary implementations of a tuning unit 320-1, 320-2, 320-3 (respectively PID, PIID, PII, where in the figures I1 refers to a first integral and I2 to a second integral) are shown in FIGS. 3a-3c showing as input the error value 225 and the tuning value 227 as output. The skilled person will appreciate that these configurations are illustrated by way of example only, and that other configurations may be possible.

Figure 4:
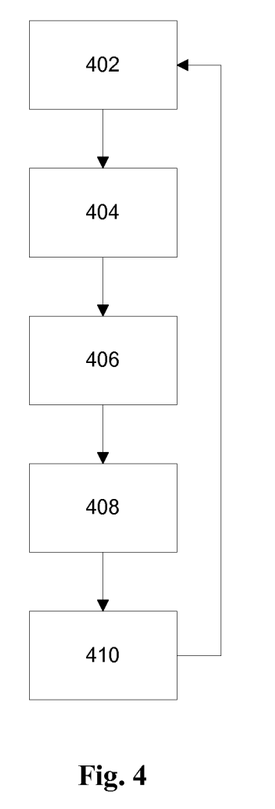
FIG. 4 depicts a flow chart of an example of a method for controlling a radiation source.

FIG. 4 shows a flow chart of an embodiment of a method for controlling a parameter of a radiation source. The method may be performed by a control system as described with reference to FIGS. 2 and 3. The control system comprises a plurality of controllers. A first controller receives a setpoint value at step 402. The first controller receives a further sensor value from a sensor at step 404. The controller adjusts, at step 406, the received setpoint value based on the received further sensor value to give an output value. Adjustment may also be based on a previously received setpoint value (e.g. a setpoint value received for a previous pulse). The output value is output at step 408 to cause a radiation source to operate in accordance with an output value. A switch then switches at step 410 from the first controller to a second controller and the method is repeated.

Figure 5:
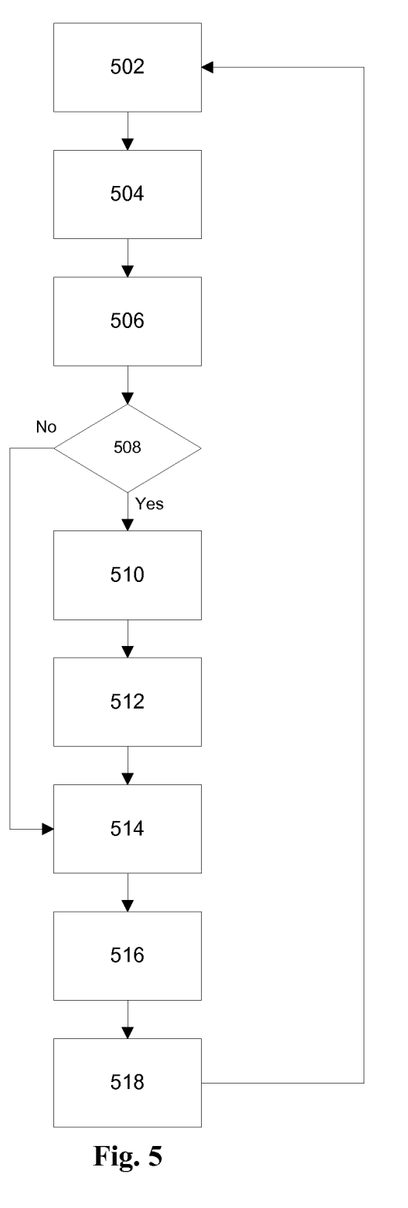
FIG. 5 depicts a flow chart of another example of a method for controlling a radiation source.

FIG. 5 shows a flow chart of another embodiment of a method for controlling a parameter of a radiation source. The method is similar to that described with reference to FIG. 4 and may be performed by a control system as described with reference to FIGS. 2 and 3. A first controller receives a setpoint value at step 502. The first controller receives a second sensor value from the sensor (e.g. a next reading from the sensor) at step 504. The controller then generates an adjustment value, at step 506, for the received setpoint value based on the received second sensor value. At step 508, a decision is made as to whether or not the adjustment value should be limited. If yes, the method continues to step 510, at which the adjustment value is limited. For example, as described above, where the controller comprises a limiter, the limiter may limit the adjustment value to avoid detrimental stress to the laser. At step 512 the controller communicates to the other controller(s) within the control system that the adjustment value has been limited. At step 514, the setpoint value is adjusted based on the adjustment value (which may or may not have been limited in a previous step). At step 516, the adjusted setpoint value is output to cause a radiation source to operate in accordance with the adjusted setpoint value. A switch then switches at step 518 from the first controller to a second controller and the method is repeated. If, it is determined, at step 508, that no limiting is required, processing passes directly from step 508 to step 514.

The second controller may adjust the setpoint value on the basis of the communicated adjustment to the setpoint value sent from the first controller at step 512.

It will be clear to the skilled person that the method steps described with reference to FIGS. 4 and 5 do not necessarily have to be performed in the stated order. For example, steps 402 and 404 may be performed in the opposite order or simultaneously. This also applies to steps 502 and 504. Similarly, step 502 need not necessarily be performed before step 504. Similarly, step 512 need not be performed before step 514.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention. Thus it will be apparent to one skilled in the art that modifications may be made to the invention as described without departing from the scope of the clauses set out below.

CLAUSES

1. A control system for controlling a laser, the control system comprising:
a sensor for sensing a physical value indicative of a characteristic of a laser beam emitted by the laser;
a switch;
a first controller and a second controller, wherein each controller is configured, to:
  receive a setpoint value;
  receive a further sensor value from the sensor;
  adjust the received setpoint value based on the received further sensor value to give an output value;
  cause the laser to operate in accordance with the output value;
wherein:
  an output value from the first controller is different from an output value from the second controller;
  the switch is configured to switch between the controllers such that output values are provided from each controller in a cyclic fashion;
  the controllers are configured to communicate with one another; and
  least one adjustment to the setpoint value made by the second controller is determined at least in part by at least one adjustment to the setpoint value made by the first controller.

2. The control system of clause 1, wherein the laser is a pulsed laser and the switch is configured to switch between the controllers on a pulse to pulse basis.

3. The control system of either of the preceding clauses, wherein the laser is configured to provide more than one type of output.

4. The control system of clause 3, wherein each controller is configured to control a respective type of output from the laser.

5. The control system of any preceding clause, wherein each controller comprises a limiter configured to adjust the output value in accordance with predetermined limits.

6. The control system of clause 5, wherein the limiters of each controller are configured to communicate with one another.

7. The control system of any preceding clause, wherein each controller comprises a tuning unit configured to adjust the setpoint value based on the received further sensor value to give the output value.

8. The control system of any preceding clause, wherein the output value is configured to control the energy dose of the laser.

9. The control system of any of clauses 1 to 8, wherein the output value is configured to control the wavelength emitted by the laser.

10. A radiation source comprising a laser and a control system according to any of the preceding clauses, wherein the control system is configured to control the laser of the radiation source.

11. A lithographic system comprising a radiation source according to clause 10 and a lithographic apparatus, the lithographic apparatus comprising:
  an illumination system for conditioning a radiation beam emitted by the radiation source;
  a support structure for supporting a patterning device, the patterning device serving to impart the radiation beam with a pattern in its cross-section;
  a substrate table for holding a substrate; and,
  a projection system for projecting the patterned radiation beam onto a target portion of the substrate.

12. A method for controlling a parameter of a laser using a first and a second controller, the method comprising:
  cycling between a first controller and a second controller, wherein each controller performs the steps of:
    a) receive a setpoint value for the parameter;
    b) receive a further sensor value from a sensor;
    c) adjust the received setpoint value based on the received further sensor value to give an output value;
    d) cause the laser to operate in accordance with the output value;
  wherein the controllers communicate with one another and wherein at least one adjustment to the setpoint value made by the second controller is determined at least in part by at least one adjustment to the setpoint value made by the first controller.

13. The method of clause 12, wherein the laser is a pulsed laser and the cycling between the controllers is on a pulse to pulse basis.

14. The method of clause 12 or 13, wherein the laser provides more than one type of output.

15. The method of clause 14, wherein each controller further controls a respective type of output from the laser.

16. The method of any of clauses 12 to 15, wherein each controller further adjusts the output value in accordance with predetermined limits.

17. The method of any of clauses 12 to 16, wherein each controller comprises a PID controller and further adjusts the setpoint value based on the received further sensor value to give the output value.

18. The method of any of clauses 12 to 17, wherein the output value is used to control the energy dose of the laser.

19. The method of any of clauses 12 to 18, wherein the output value is used to control the wavelength emitted by the laser.

20. A computer program comprising computer readable instructions configured to cause a computer to carry out a method according to any one of clauses 12 to 19.

21. A computer readable medium carrying a computer program according to clause 20.

22. A computer apparatus for a radiation source comprising:
- a memory storing processor readable instructions; and
- a processor arranged to read and execute instructions stored in said memory;

wherein said processor readable instructions comprise instructions arranged to control the computer to carry out a method according to any one of clauses 12 to 19.

The invention claimed is:

1. A control system for controlling a laser, the control system comprising:
- a sensor configured to sense a value indicative of a characteristic of a laser beam emitted by the laser;
- a switch; and
- a first controller and a second controller, wherein each controller is configured to:
  - receive a setpoint value;
  - receive a further sensor value from the sensor;
  - adjust the received setpoint value based on the received further sensor value to give a respective output value; and
  - cause the laser to operate in accordance with each respective output value, wherein:
- the respective output value from the first controller is different from the respective output value from the second controller, but each respective output value controls the characteristic of the laser beam;
- the switch is configured to switch between the controllers such that respective output values are provided from the controllers in a cyclic fashion;
- the controllers are configured to communicate with one another; and
- at least one adjustment to the setpoint value made by the second controller is determined at least in part by at least one adjustment to the setpoint value made by the first controller.

2. The control system of claim 1, wherein the laser is a pulsed laser and the switch is configured to switch between the controllers on a pulse to pulse basis.

3. The control system of claim 1, wherein the laser is configured to provide more than one type of output.

4. The control system of claim 3, wherein each controller is configured to control a respective type of output from the laser.

5. The control system of claim 1, wherein each controller comprises a limiter configured to adjust the output value in accordance with predetermined limits.

6. The control system of claim 5, wherein the limiters of each controller are configured to communicate with one another.

7. The control system of claim 1, wherein each controller comprises a tuning unit configured to adjust the setpoint value based on the received further sensor value to give the output value.

8. The control system of claim 1, wherein the output value is configured to control the energy dose of the laser.

9. The control system of claim 1, wherein the output value is configured to control the wavelength emitted by the laser.

10. A radiation source comprising a laser and a control system according to claim 1, wherein the control system is configured to control the laser of the radiation source.

11. A lithographic system comprising the radiation source of claim 10, and a lithographic apparatus, the lithographic apparatus comprising:
- an illumination system for conditioning a radiation beam emitted by the radiation source;
- a support structure for supporting a patterning device, the patterning device serving to impart the radiation beam with a pattern in its cross-section;
- a substrate table for holding a substrate; and
- a projection system for projecting the patterned radiation beam onto a target portion of the substrate.

12. A method for controlling a parameter of a laser using a first and a second controller, the method comprising:
- cycling between the first controller and the second controller, wherein each controller performs the steps of:
  - a) receiving a setpoint value for the parameter;
  - b) receiving a further sensor value from a sensor;
  - c) adjusting the received setpoint value based on the received further sensor value to give a respective output value; and
  - d) causing the laser to operate in accordance with each respective output value,
  - wherein the respective output value from the first controller is different from the respective output value from the second controller, but each respective output value controls the parameter of the laser beam, and
  - wherein the controllers communicate with one another and wherein at least one adjustment to the setpoint value made by the second controller is determined at least in part by at least one adjustment to the setpoint value made by the first controller.

13. The method of claim 12, wherein the laser is a pulsed laser and the cycling between the controllers is on a pulse to pulse basis.

14. The method of claim 12, wherein each controller further controls at least one of:
- a respective type of output from the laser; and
- the output value in accordance with predetermined limits.

15. The method of claim 12, wherein each respective output value is used to control at least one of:
- the energy dose of the laser; and
- the wavelength emitted by the laser.

* * * * *